(12) United States Patent
Kim et al.

(10) Patent No.: US 7,355,785 B2
(45) Date of Patent: Apr. 8, 2008

(54) GAIN-CLAMPED SEMICONDUCTOR OPTICAL AMPLIFIER

(75) Inventors: Ho-In Kim, Yongin-si (KR);
Jeong-Seok Lee, Anyang-si (KR);
In-Kuk Yun, Suwon-si (KR);
Hyun-Cheol Shin, Suwon-si (KR);
Seung-Woo Kim, Seoul (KR);
Seong-Taek Hwang, Pyeongtaek-si (KR)

(73) Assignee: Samsung Electronics Co., Ltd., Yeongtong-Gu, Suwon-Si, Gyeonggi-Do (KR)

( * ) Notice: Subject to any disclaimer, the term of this patent is extended or adjusted under 35 U.S.C. 154(b) by 352 days.

(21) Appl. No.: 10/825,816

(22) Filed: Apr. 16, 2004

(65) Prior Publication Data

US 2005/0122571 A1 Jun. 9, 2005

(30) Foreign Application Priority Data

Oct. 10, 2003 (KR) .................. 10-2003-0070670

(51) Int. Cl.
*H01S 3/30* (2006.01)
(52) U.S. Cl. .................. 359/337; 359/344; 359/333; 359/349
(58) Field of Classification Search .......... 359/344, 359/337, 248; 372/20, 96, 32, 98
See application file for complete search history.

(56) References Cited

U.S. PATENT DOCUMENTS

| 4,745,607 | A | * | 5/1988 | Koch | 372/45.01 |
|---|---|---|---|---|---|
| 5,140,149 | A | * | 8/1992 | Sakata et al. | 257/436 |
| 5,177,758 | A | * | 1/1993 | Oka et al. | 372/50.11 |
| 5,239,410 | A | * | 8/1993 | Nishimura et al. | 359/344 |
| 5,347,533 | A | * | 9/1994 | Higashi et al. | 372/96 |
| 5,586,131 | A | * | 12/1996 | Ono et al. | 372/19 |
| 5,642,371 | A | * | 6/1997 | Tohyama et al. | 372/45.01 |
| 5,715,268 | A | * | 2/1998 | Lang et al. | 372/50.22 |
| 5,757,832 | A | * | 5/1998 | Uchida | 372/45.01 |
| 5,901,116 | A | * | 5/1999 | Quine | 368/117 |
| 5,946,336 | A | * | 8/1999 | Mizutani et al. | 372/50.1 |
| 6,252,895 | B1 | * | 6/2001 | Nitta et al. | 372/50.1 |
| 6,563,631 | B2 | * | 5/2003 | Delprat et al. | 359/344 |
| 6,678,289 | B2 | * | 1/2004 | Kim | 372/20 |
| 6,751,013 | B1 | * | 6/2004 | Wu | 359/337 |
| 6,771,681 | B2 | * | 8/2004 | Bang et al. | 372/46.01 |
| 6,806,114 | B1 | * | 10/2004 | Lo | 438/36 |
| 6,865,020 | B2 | * | 3/2005 | Kim et al. | 359/344 |
| 6,980,345 | B2 | * | 12/2005 | Kim et al. | 359/248 |
| 7,010,009 | B2 | * | 3/2006 | Kim | 372/43.01 |
| 2003/0067678 | A1 | * | 4/2003 | Shibata et al. | 359/344 |
| 2004/0109221 | A1 | * | 6/2004 | Kim et al. | 359/248 |

* cited by examiner

*Primary Examiner*—Douglas W. Owens
*Assistant Examiner*—Chuc Tran
(74) *Attorney, Agent, or Firm*—Cha & Reiter, LLC (57) ABSTRACT

A gain-clamped semiconductor optical amplifier is disclosed. The amplifier includes a gain waveguide for amplifying an optical signal input to the gain waveguide, and a grating layer, in contact with the gain waveguide, having a first grating disposed at a first end portion.

9 Claims, 8 Drawing Sheets

GAIN-CLAMPED SEMICONDUCTOR OPTICAL AMPLIFIER

CLAIM OF PRIORITY

This application claims priority to an application entitled "Gain-clamped semiconductor optical amplifier," filed in the Korean Intellectual Property Office on Oct. 10, 2003 and assigned Serial No. 2003-70670, the contents of which are hereby incorporated by reference.

BACKGROUND OF THE INVENTION

1. Field of the Invention

The present invention relates to a semiconductor optical amplifier for amplifying optical signals, and more particularly to a gain-clamped semiconductor optical amplifier capable of providing constant gain for output optical signals.

2. Description of the Related Art

When reaching a gain saturation region, a semiconductor optical amplifier (hereinafter, referred to as an SOA) cannot perform its function as an amplifier because of an interference phenomenon between channels. In order to prevent such a gain saturation phenomenon, conventional SOAs have used methods that stimulate lasing in the amplifiers to clamp the gain of the amplifiers.

Lasing methods, which are used to clamp the gain of the SOAs, may be largely classified into a Distributed Feedback (hereinafter, referred to as a DFB) method and a Distributed Bragg Reflector (hereinafter, referred to as a DBR) method.

Figure 1:
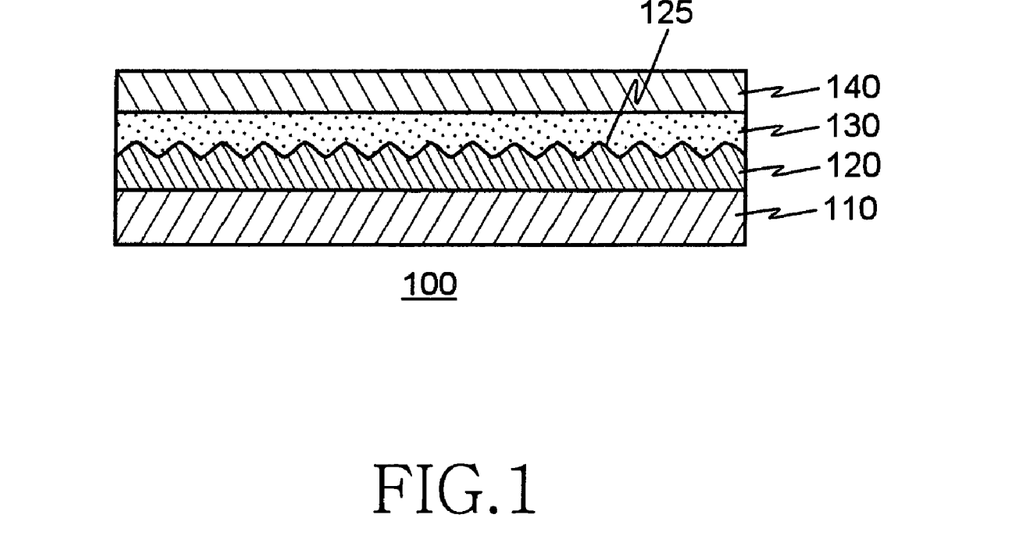
FIG. 1 is a side cross-sectional view schematically showing the construction of a conventional DFB semiconductor optical amplifier.

FIG. 1 is a side cross-sectional view schematically showing the construction of a conventional DFB SOA 100. The SOA 100 includes a substrate 110, a grating layer 120, a gain waveguide 130, and a clad 140.

The grating layer 120 is laminated on the substrate 110 and includes a grating 125 having a predetermined period with respect to the total length of the grating layer 120. The gain waveguide 130 is laminated on the grating layer 120 and amplifies an optical signal input to the gain waveguide 130. The clad 140 is laminated on the gain waveguide 130. Since the clad 140 and the grating layer 120 have refractive indices smaller than the refractive index of the gain waveguide 130, the optical signal is confined in the gain waveguide 130.

However, in the DFB SOA 100, since the grating layer 120 is formed under the gain waveguide 130 having electron density and photon density which vary according to the input of electric current and an optical signal, the effective grating period of the grating 125 varies according to such exterior factors. The variation of the effective grating period of the grating 125 causes instability of a lasing due to the grating 125. Therefore, since the gain property of the SOA 100 is unstable, it is not possible to obtain a clamped gain property.

In the conventional DBR method, a passive waveguide is formed. A grating layer including gratings is disposed under the passive waveguide. In the DBR method, the grating layer is disposed under the passive waveguide so that the grating layer does not experience variation of electron density according to input of electric current. This prevents the effective grating period from being easily changing. Therefore, a stable lasing can be obtained and the gain property of the SOA is also stabilized. However, construction and manufacture of the gain waveguide and the passive waveguide are difficult in comparison with the above-mentioned DFB method. In addition, optical coupling loss exists between the gain waveguide and the passive waveguide, so that properties of the SOA are deteriorated. In the DBR SOA, methods for forming the passive waveguide in contact with the gain waveguide include a butt-joint method and a dual waveguide method.

Figure 2:
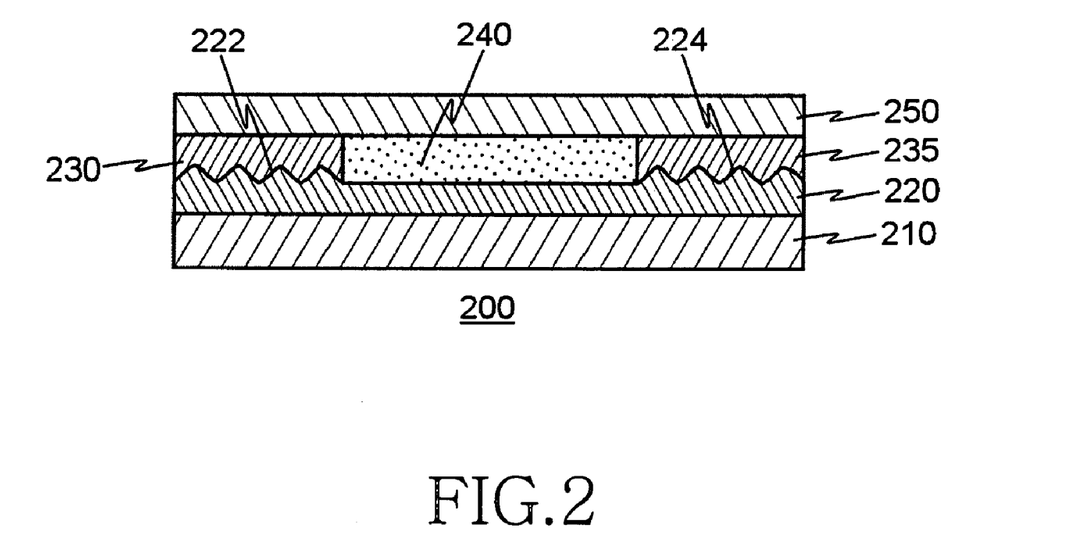
FIG. 2 is a side cross-sectional view schematically showing the construction of a conventional DBR semiconductor optical amplifier employing a butt-joint method.

FIG. 2 is a side cross-sectional view schematically showing a construction of a conventional DBR SOA 200 employing the butt-joint method. The SOA 200 includes a substrate 210, a grating layer 220, a gain waveguide 240, first and second passive waveguides 230 and 235, and a clad 250.

The grating layer 220 is laminated on the substrate 210 and includes first and second gratings 222 and 224 formed at a first end portion and a second end portion of the grating layer 220. The gain waveguide 240 is laminated on the grating layer 220 to be out of contact with the first and the second gratings 222 and 224. The gain waveguide 240 amplifies an optical signal input to the gain waveguide 240. The first passive waveguide 230 is laminated on the grating layer 220 to be in contact with one end of the gain waveguide 240, and the second passive waveguide 235 is laminated on the grating layer 220 to be in contact with the other end of the gain waveguide 240. The clad 250 is laminated on the gain waveguide 240, the first passive waveguides 230, and the second passive waveguides 235. The clad 250 and the grating layer 220 have refractive indices smaller than those of the gain waveguide 240 and the passive waveguides 230 and 235.

However, it is difficult to manufacture the DBR SOA 200 employing the butt-joint method. In addition, reflection inevitably occurs at contact portions between the gain waveguide 240 and the first passive waveguides 230, and between the gain waveguide 240 and the second passive waveguides 235. Furthermore, optical coupling efficiency is not perfect. Therefore, properties of the SOA 200 are deteriorated.

Figure 3:
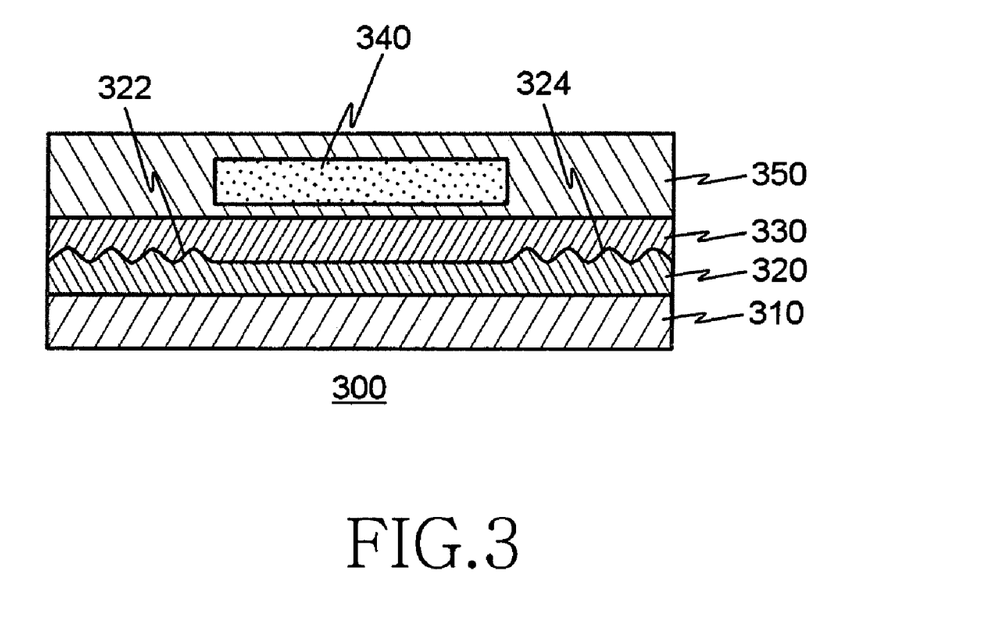
FIG. 3 is a side cross-sectional view schematically showing the construction of a conventional DBR semiconductor optical amplifier employing a dual waveguide method.

FIG. 3 is a side cross-sectional view schematically showing a construction of a conventional DBR SOA 300 employing the dual waveguide method. The SOA 300 includes a substrate 310, a grating layer 320, a passive waveguides 330, a gain waveguide 340, and a clad 350.

The grating layer 320 is laminated on the substrate 310 and includes first and second gratings 322 and 324 formed at both sides of the grating layer 320. The passive waveguides 330 is laminated on the grating layer 320. The gain waveguide 340 has a length shorter than that of the passive waveguides 330 and is laminated on a central portion of the passive waveguides 330. The gain waveguide 340 amplifies an optical signal input to the gain waveguide 340. The clad 350 is laminated on the passive waveguides 330 to surround the gain waveguide 340. The grating layer 320 and the clad 350 have refractive indices smaller than those of the gain waveguide 340 and the passive waveguide 330. An optical signal, which is input to one end of the passive waveguide 330, progresses inside of the passive waveguide 330. The optical signal is then transferred to the gain waveguide 340 to be amplified. Afterward, the optical signal is transferred to the passive waveguide 330 to be output through the other end of the passive waveguide 330.

However, there exists limitations in the optical coupling efficiency between the gain waveguide 340 and the passive waveguide 330, therefore properties of the DBR SOA 300 are also deteriorated.

Accordingly, there exists a need in the art for improved semiconductor optical amplifiers.

SUMMARY OF THE INVENTION

One aspect of the present invention is to provide a semiconductor optical amplifier that can achieve stable lasing even with only one gain waveguide, without separately constructing a gain waveguide and a passive waveguide.

One embodiment of the present invention is directed to a gain-clamped semiconductor optical amplifier including a gain waveguide for amplifying an optical signal input to the gain waveguide, and a grating layer being in contact with the gain waveguide and including a first grating disposed at a first end portion.

BRIEF DESCRIPTION OF THE DRAWINGS

The above and other aspects, features and embodiments of the present invention will be more apparent from the following detailed description taken in conjunction with the accompanying drawings, in which:

FIG. 8b is a plan view of the semiconductor optical amplifier shown in FIG. 8a;

FIG. 9 is a graph showing a lasing mode of the semiconductor optical amplifier shown in FIG. 8a;

FIG. 10b is a plan view of the semiconductor optical amplifier shown in FIG. 10a;

FIG. 11 is a graph showing a lasing mode of the semiconductor optical amplifier shown in FIG. 10a;

DETAILED DESCRIPTION OF THE INVENTION

Hereinafter, embodiments according to the present invention will be described with reference to the accompanying drawings. For the purposes of clarity and simplicity, a detailed description of known functions and configuration incorporated herein will be omitted as it may obscure the subject matter of the present invention.

Figure 4:
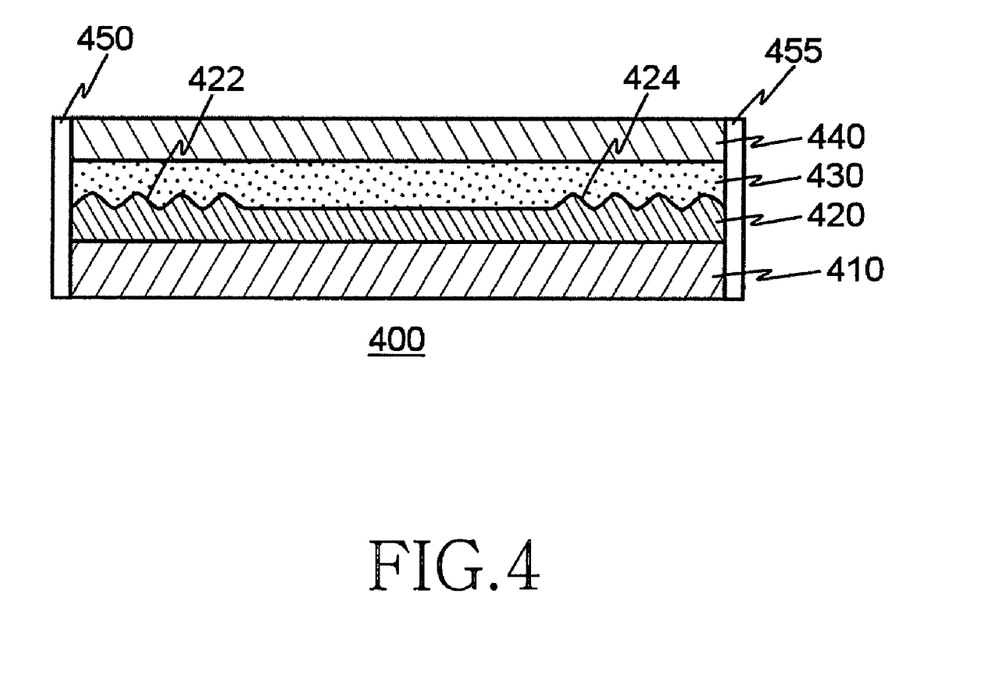
FIG. 4 is a side cross-sectional view showing the construction of a gain-clamped semiconductor optical amplifier according to a first embodiment of the present invention.

FIG. 4 is a side cross-sectional view showing the construction of a gain-clamped semiconductor optical amplifier 400 according to a first embodiment of the present invention. The semiconductor optical amplifier (hereinafter, referred to as SOA) 400 includes a substrate 410, a grating layer 420, a gain waveguide 430, a clad 440, and first and second anti-reflection layers 450 and 455.

The grating layer 420 is laminated on the substrate 410 and includes first and second gratings 422 and 424 formed at both sides of the grating layer 420. The gain waveguide 430 is laminated on the grating layer 420 to be in contact with the first and the second gratings 422 and 424. The gain waveguide 430 amplifies an optical signal input to the gain waveguide 430. The clad 440 is laminated on the gain waveguide 430 and has a refractive index smaller than that of the gain waveguide 430. The first anti-reflection layers 450 is coated on a first end_surface of the SOA 400, and the second anti-reflection layers 455 is coated on a second end surface of the SOA 400.

The gain waveguide 430 may include various materials, such as InGaAs, InGaAsP, InGaAlAs, AlGaAs, and InAlAs, which are used in a compound semiconductor laser. The gain waveguide 430 may includes a double hetero (DH) structure, a separate confinement hetero (SCH) structure, or a multiple quantum well structure, etc. The gain waveguide 430 and/or the clad 440 may be formed through an epitaxial growth on the gain waveguide 430. The clad 440 may contain a material such as InP or GaAs having a refractive index smaller than that of the gain waveguide 430. The grating layer 420 may employ a periodical arrangement of material having a refractive index different from the clad 440, or a structure of periodically inducing refractive indices different from the refractive index of the clad 440.

The SOA 400 generally conforms to a Distributed Bragg Reflector (DBR) method. However, in the SOA 400, the gain waveguide 430 is in contact with the first and the second gratings 422 and 424, in contrast with the conventional dual waveguide method or butt-joint method. Therefore, variation of effective refractive index due to an input of electric current and an optical signal in reduced in comparison with a Distributed Feedback (hereinafter, referred to as a DFB) method. Even when the lasing mode changes depending on the variation of effective refractive index, the lasing mode does not rapidly change in comparison with the DFB method having a stop band. Accordingly, the variation of the lasing mode does not cause a rapid change in the gain property of the SOA 400. Since the SOA 400 does not require a passive waveguide, there are no loss and reflection caused by an optical coupling process between a gain waveguide and the passive waveguide. There is no need to have the first and the second gratings 422 and 424 symmetrical to each other.

Also, when reflection factors of the first grating 422 and the second grating 424 differ from each other, it is possible to cause photon density and electric charge density for an optical signal in an input side to be different from the photon density and the electric charge density for the optical signal in an output side.

Further, in order to obtain desired output properties of the SOA 400, the reflection factors can be adjusted. For instance, if the reflection factor of the first grating 422 is elevated greater than that of the second grating 424, the photon density in the gain waveguide 430 is higher at the output side. In contrast, the electric charge density is higher at the input side. When the electric charge density is higher at the input side as described above, it is preferred to improve noise property of a SOA largely affected by the input side. For the same reason, in the case of an input side, it is further preferred to form the first grating 422 adjacent to the first end surface of the SOA 400, because the electric charge density is reduced at an interval between the first end surface and the first grating 422 when the first grating 422 is formed at a position slightly spaced from the first end surface of the SOA 400.

In one embodiment, the gain waveguide can be achieved according to a strongly index-guiding (hereinafter, referred to as an SIG) method and a weakly index-guiding (hereinafter, referred to a WIG) method, which are classified according to the ways in which a mode progressing into the gain waveguide is confined in a width direction of the gain waveguide. In the SIG method, the gain waveguide is formed to have a width within a predetermined range and is then surrounded by a clad having a refractive index smaller than that of the gain waveguide, so that the mode can be confined therein. A structure by the SIG method as described above is also called a buried hetero (BH) structure because the gain waveguide is surrounded by a clad.

Figure 5:
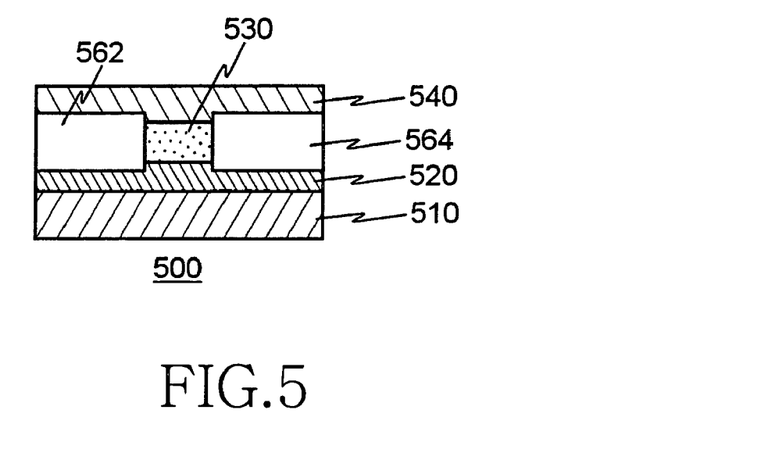
FIG. 5 is a front cross-sectional view of a semiconductor optical amplifier having the buried hetero structure according to the SIG method.

FIG. 5 is a front cross-sectional view of a semiconductor optical amplifier 500 having the buried hetero structure according to the SIG method. The SOA 500 includes a substrate 510, a grating layer 520, a gain waveguide 530, first and second current blocking layers 562 and 564, and a clad 540.

The grating layer 520 is laminated on the substrate 510 and includes first and second gratings (not shown) formed at both sides of the grating layer 520. The gain waveguide 530 is laminated on a central portion of the grating layer 520 to be in contact with the first and the second gratings. The gain waveguide amplifies an optical signal input to the gain waveguide 530. The first and the second current blocking layers 562 and 564 are laminated on the grating layer 520 to be in contact with both side surfaces of the gain waveguide 530. The clad 540 is laminated on the first and the second current blocking layers 562 and 564 and the gain waveguide 530. The first and the second current blocking layers 562 and 564 function as a clad surrounding the gain waveguide 530 and simultaneously concentrate applied current to the gain waveguide 530. The clad 540 and the first and the second current blocking layers 562 and 564 have refractive indices smaller than a refractive index of the gain waveguide 530.

In the WIG method, a gain waveguide is not formed to have a width within a predetermined range but maintains a layer structure while adjusting a thickness of a portion of the grating layer or gain waveguide, through which a mode passes, thereby inducing difference between effective refractive indices of portions of the gain waveguide, by which the mode can be confined. Structures according to the WIG method are largely classified into ridge structures and rib structures.

Figure 6:
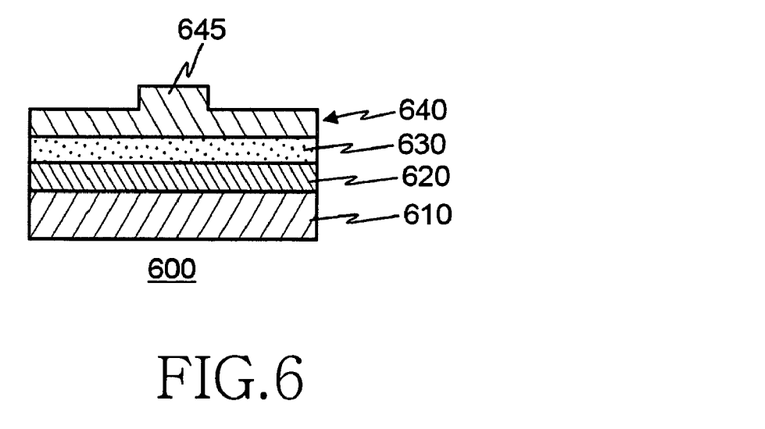
FIG. 6 is a front cross-sectional view of a semiconductor optical amplifier having the ridge structure according to the WIG method.

FIG. 6 is a front cross-sectional view of a semiconductor optical amplifier 600 having the ridge structure according to the WIG method. The SOA 600 includes a substrate 610, a grating layer 620, a gain waveguide 630, and a clad 640.

The grating layer 620 is laminated on the substrate 610 and includes first and second gratings (not shown) formed at both sides of the grating layer 620. The gain waveguide 630 is laminated on a central portion of the grating layer 620 to be in contact with the first and the second gratings. The gain waveguide amplifies an optical signal input to the gain waveguide 630. The clad 640 is laminated on the gain waveguide 630, and includes a ridge 645 protruding upward from a central portion of the clad 640 through which a mode passes. The clad 640 has a refractive index smaller than that of the gain waveguide 630.

Figure 7:
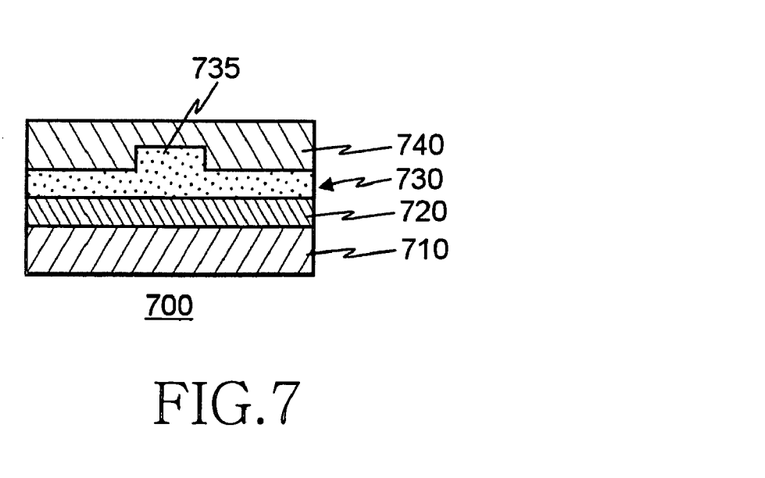
FIG. 7 is a front cross-sectional view of a semiconductor optical amplifier having the rib structure according to the WIG method.

FIG. 7 is a front cross-sectional view of a semiconductor optical amplifier 700 having the rib structure according to the WIG method. The SOA 700 includes a substrate 710, a grating layer 720, a gain waveguide 730, and a clad 740.

The grating layer 720 is laminated on the substrate 710 and includes first and second gratings (not shown) formed at both sides of the grating layer 720. The gain waveguide 730 is laminated on a central portion of the grating layer 720 to be in contact with the first and the second gratings. The gain waveguide includes a rib 735 protruding upward from a central portion of the gain waveguide 730 through which a mode passes. The gain waveguide 730 amplifies an optical signal input to the gain waveguide 730. The clad 740 is laminated on the gain waveguide 730 and has a refractive index smaller than that of the gain waveguide 730.

Since the WIG method does not include a process of etching and re-growing a gain waveguide, it is preferred to use the WIG method in forming an Al-based compound semiconductor that it is difficult to etch and re-grow.

To reduce gain ripple due to reflection from the first and the second end surfaces of the SOA is important to obtain stable gain properties of the SOA. In order to reduce the reflection from the first and the second end surfaces, the first and the second end surfaces can be subjected to an anti-reflection coating process.

According to an additional method for reducing the reflection, the gain waveguide can be inclined with a predetermined angle with respect to a common normal line of the first and the second end surfaces. Further, according to another method for reducing the reflection, the gain waveguide can be slightly spaced from the first and the second end surfaces. Optical signals deviated from the gain waveguide are then reflected from the first end surface or the second end surface and then return to the gain waveguide at a reduced ratio.

Typically, since the SOA must amplify an optical signal, which is input to the SOA through a first end surface optically connected to a single mode optical fiber, and transmit the amplified optical signal to a single mode optical fiber optically connected to a second end surface, it is important to improve coupling efficiency between the single mode optical fiber and the SOA. In order to improve the coupling efficiency, it is usual and preferred that the gain waveguide has mode conversion regions formed at both sides thereof, which increase the mode size of the SOA smaller than that of the single mode optical fiber. Otherwise, even without the mode conversion regions, the mode can be effectively expanded if the gain waveguide has an increased width and very reduced thickness. As a matter of course, installation of the mode conversion regions needs not be taken into consideration in the arrangement of the grating layer.

An effective grating period of a grating layer determines a laser oscillation wavelength due to grating reflection. Normally, the grating period is determined that avoids the wavelength range of the optical signal used in a wavelength range shorter 10~80 nm than a maximum gain wavelength of an SOA. The length of the gratings may be changed according to thickness, composition materials, or composition methods. When the first grating has length different from that of the second grating, the first grating may have length corresponding to 3~50% of the total length of a gain layer. Also, the second grating may have length from 0 to the length of the first grating according to desired properties.

Figure 8A:
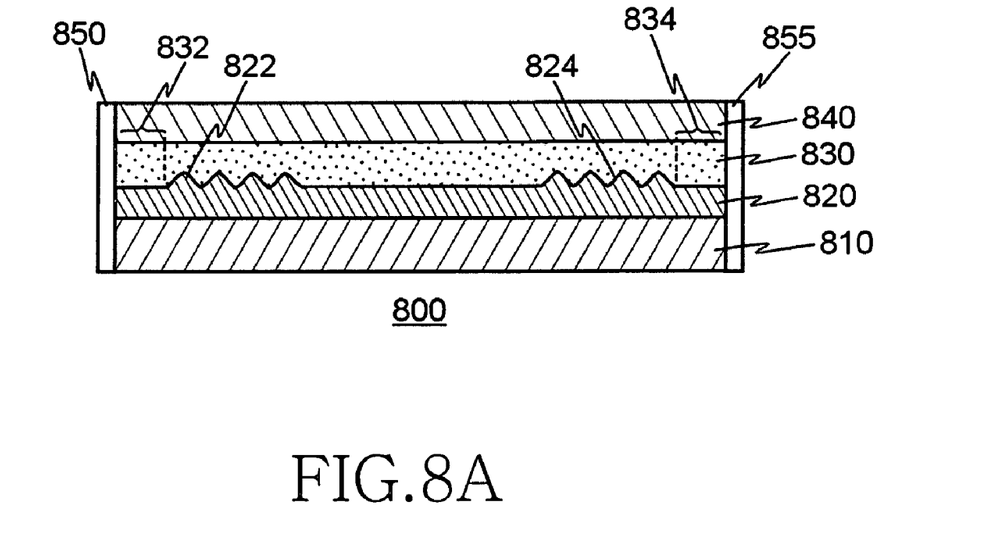
FIG. 8a is a side cross-sectional view showing the construction of a gain-clamped semiconductor optical amplifier according to a second embodiment of the present invention.
Figure 8B:
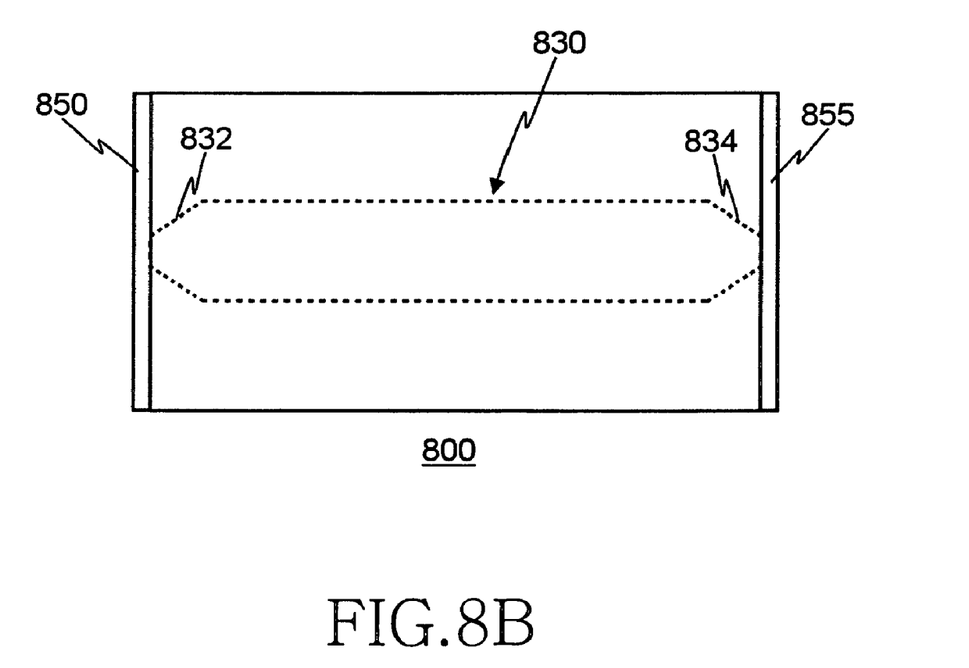
Figure 9:
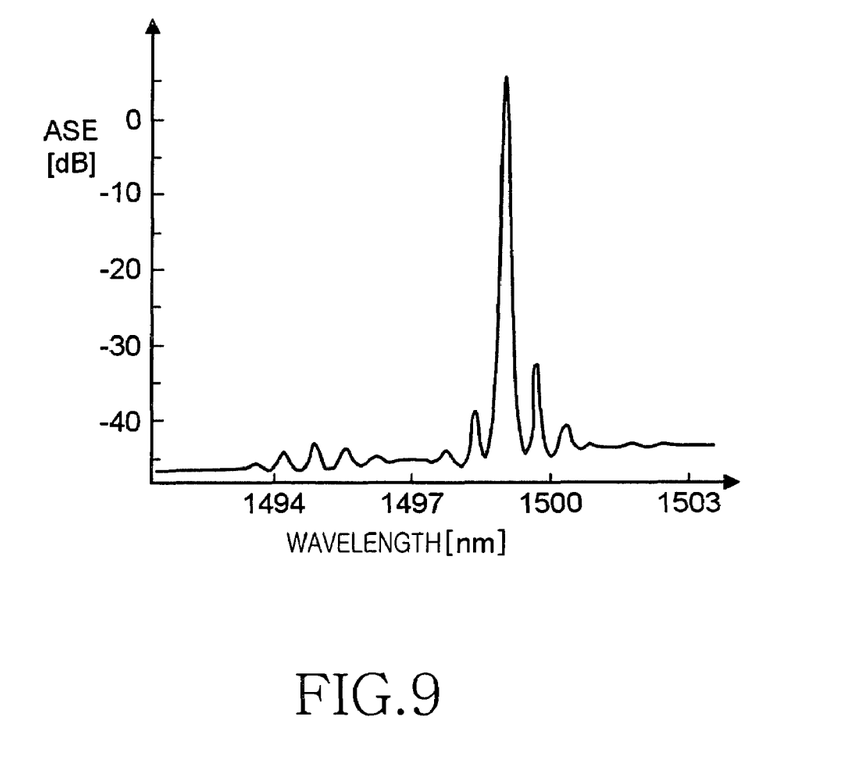

FIG. 8a is a side cross-sectional view showing the construction of a gain-clamped semiconductor optical amplifier 800 according to a second embodiment of the present invention. FIG. 8b is a plan view of the semiconductor optical amplifier 800 shown in FIG. 8a. FIG. 9 is a graph showing a lasing mode of the semiconductor optical amplifier 800 shown in FIG. 8a. The SOA 800 includes a substrate 810, a grating layer 820, a gain waveguide 830, and a clad 840.

The grating layer 820 is laminated on the substrate 810 and includes first and second gratings 822 and 824 formed at both sides of the grating layer 820. The first grating 822 is spaced from a first end surface of the SOA 800, and the second grating 824 is spaced from a second end surface of the SOA 800. The gain waveguide 830 is laminated on the grating layer 820 to be in contact with the first and the second gratings 822 and 824. The gain waveguide 830 amplifies an optical signal input to the gain waveguide 830. The gain waveguide 830 includes first and second mode conversion regions 832 and 834 formed at both sides of the gain waveguide 830. In the first mode conversion region 832, the gain waveguide 830 has a width that becomes narrower as it goes to the first end surface of the SOA 800. In the second mode conversion region 834, the gain waveguide 830 has a width that becomes narrower as it goes to the second end surface of the SOA 800. The first and the second gratings 822 and 824 are overlapped with the first and the second mode conversion regions 832 and 834. The clad 840 is laminated on the gain waveguide 830 and has a refractive index smaller than that of the gain waveguide 830.

The SOA 800 has a buried hetero (BH) structure. In the buried hetero structure, the gain waveguide 830 in the mode conversion regions 832 and 834 has a width which becomes narrower or wider as it goes to a corresponding end surface of the SOA 800, as shown in FIG. 8b. Further, it is noted that instead of the width, a thickness of the gain waveguide 830 may be changed.

As shown in FIG. 9, the SOA 800 outputs the lasing mode having a high side mode suppression ratio (hereinafter, referred to as SMSR). In this example, the input current is 200 mA, the resolution is 0.1 nm, and the SMSR is 38 dB.

Even in the rib or ridge structures of the WIG method, a mode conversion region is formed by changing a width and/or thickness of the rib or the ridge. In any case, the magnitude of a gain waveguide varies in the mode conversion region. If a grating is formed to be partially overlapped with the mode conversion region, an effective grating period in the mode conversion region is not constant, but it varies according to variation of an effective refractive index. This is called a chirped grating. In a lasing mode due to the grating, if the effective grating period is constant, a mode corresponding to such an effective grating period mainly oscillates. In contrast, in the chirped grating, multiple modes corresponding to effective grating periods within a predetermined range simultaneously oscillates, so that an SMSR is deteriorated.

When the SMSR is deteriorated, a four wave mixing (hereinafter, referred to a FWM) occurs due to interference between a main lasing mode and a lasing mode adjacent to the main lasing mode. Therefore, properties of the SOA may be deteriorated. In order to avoid affection such as the FWM due to such a chirp effect, the grating is formed at positions adjacent to the mode conversion region so as not to overlap with the mode conversion region. Therefore, a stable lasing mode having a high SMSR can be obtained and the FWM can be restricted.

Figure 10A:
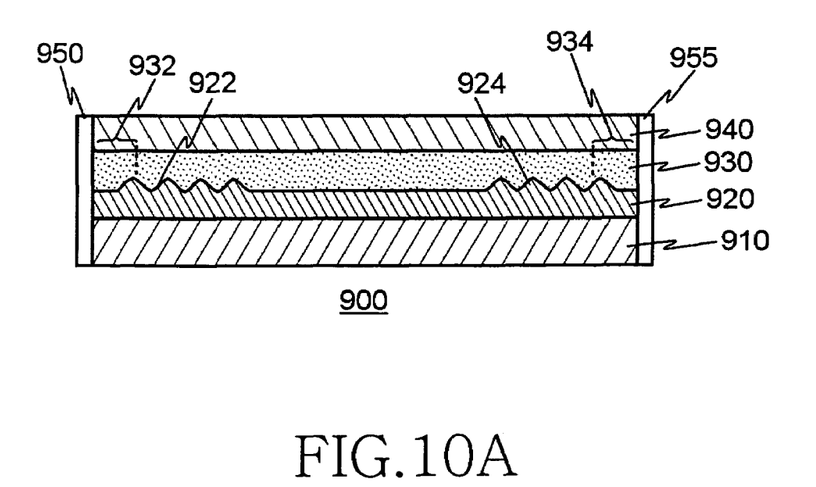
FIG. 10a is a side cross-sectional view showing the construction of a gain-clamped semiconductor optical amplifier according to a third embodiment of the present invention.
Figure 10B:
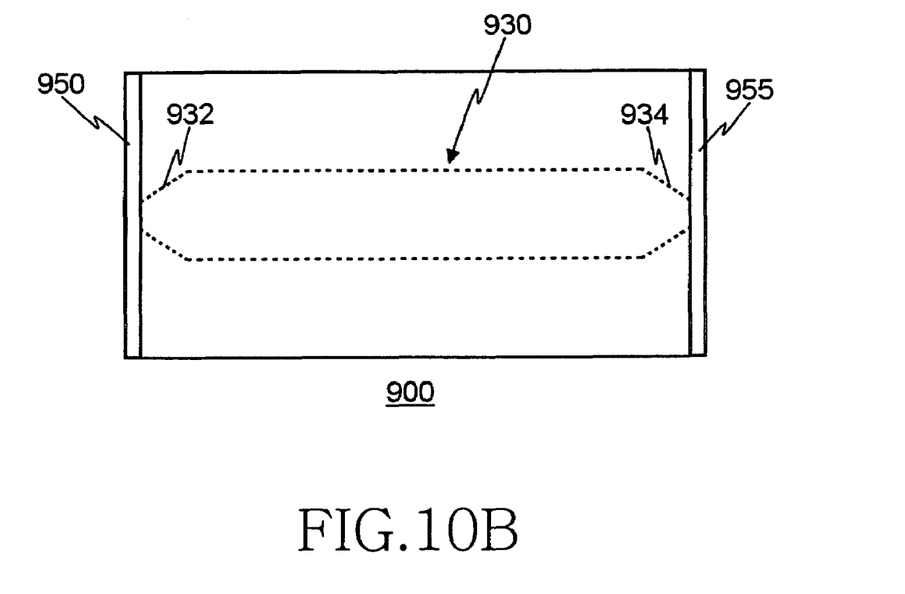
Figure 11:
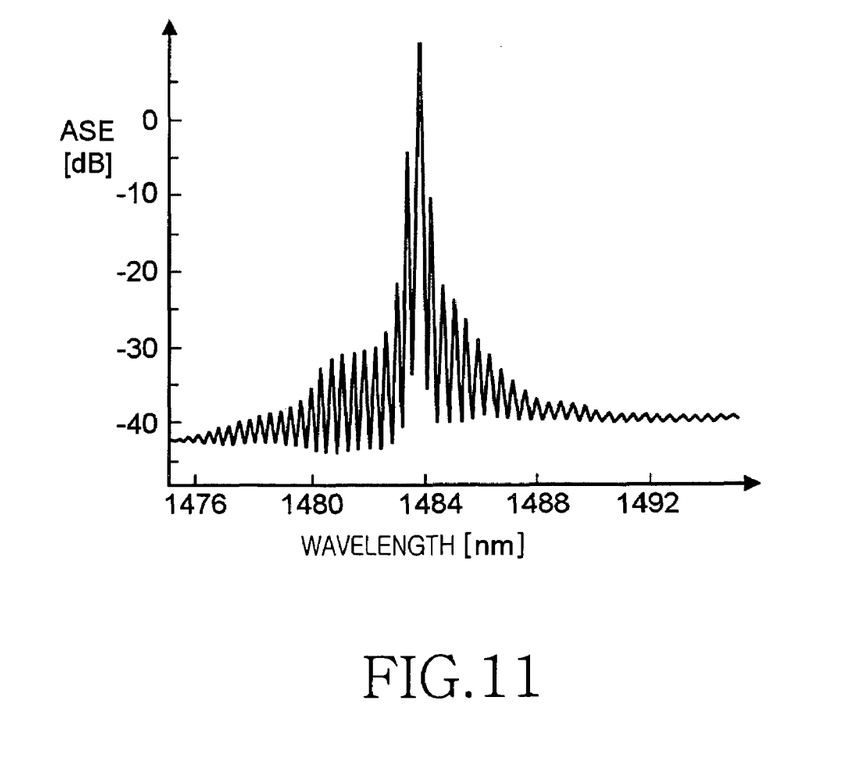

FIG. 10a is a side cross-sectional view showing the construction of a gain-clamped semiconductor optical amplifier 900 according to a third embodiment of the present invention. FIG. 10b is a plan view of the semiconductor optical amplifier 900 shown in FIG 10a. FIG. 11 is a graph showing a lasing mode of the semiconductor optical amplifier 900 shown in FIG. 10a. The SOA 900 includes a substrate 910, a grating layer 920, a gain waveguide 930, and a clad 940.

The grating layer 920 is laminated on the substrate 910 and includes first and second gratings 922 and 924 formed at both sides of the grating layer 920. The first grating 922 is spaced from a first end surface of the SOA 900, and the second grating 924 is spaced from a second end surface of the SOA 900. The gain waveguide 930 is laminated on the grating layer 920 to be in contact with the first and the second gratings 922 and 924. The gain waveguide 930 amplifies an optical signal input to the gain waveguide 930. The gain waveguide 930 includes first and second mode conversion regions 932 and 934 formed at both sides of the gain waveguide 930.

In the first mode conversion region 932, the gain waveguide 930 has a width that becomes narrower as it goes to the first end surface of the SOA 900. In the second mode conversion region 934, the gain waveguide 930 has a width that becomes narrower as it goes to the second end surface of the SOA 900. The first grating 922 is partially overlapped with the first mode conversion region 932, and the second grating 924 is partially overlapped with the second mode conversion region 934. The clad 940 is laminated on the gain waveguide 930 and has a refractive index smaller than that of the gain waveguide 930.

As shown in FIG. 11, the SOA 900 outputs the lasing mode having a deteriorated SMSR. Since a corresponding grating 922 or 924 is overlapped with the first mode conversion region 932 or the second grating 934 is overlapped with the second mode conversion region 934, a chirp effect occurs. Therefore, the SMSR of the lasing mode is deteriorated and the FWM phenomenon may be excessive. In this example, the input current is 200 mA, the resolution is 0.1 nm, and the SMSR is 13 dB.

However, in the above example, since lasing modes that have similar magnitudes compete each other, the lasing mode does not rapidly change even though the effective grating period varies according to variations of electric charge density in the gain waveguide 930. Accordingly, this can contribute to stabilize the gain property of the SOA 900. For instance, when the intensity of an optical signal input to the SOA 900 increases and reaches a position adjacent to a saturation region, a spatial hole burning (SHB) effect, in which electric charge is consumed due to increase of photon density in the gain waveguide 930, occurs. In this situation, variation of the lasing mode may occur. When the SMSR is large, the lasing mode rapidly varies. Accordingly, when the gain property of an output optical signal is graphed, the gain severely varies around the saturation region. In contrast, when the SMSR is small, the lasing mode does not rapidly vary. Accordingly, variation of the gain is relatively slow.

As described above, whether or not to overlap the grating with the mode conversion region has a compensation relation with respect to stabilization of the FWM and the gain property. Accordingly, it is necessary to avoid the overlapping between the grating and the mode conversion region or adjust the degree of overlapping between the grating and the mode conversion region according to desired properties of the semiconductor optical amplifier.

Figure 12:
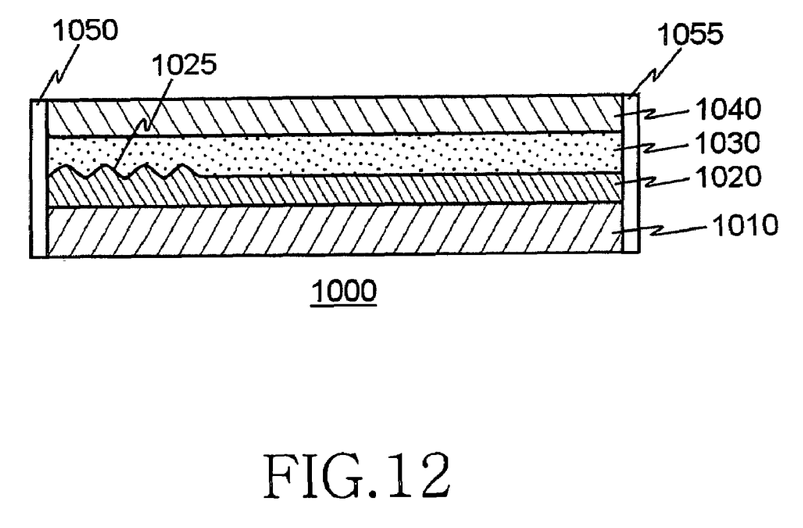
FIG. 12 is a side cross-sectional view showing the construction of a gain-clamped semiconductor optical amplifier according to a fourth embodiment of the present invention.
Figure 13:
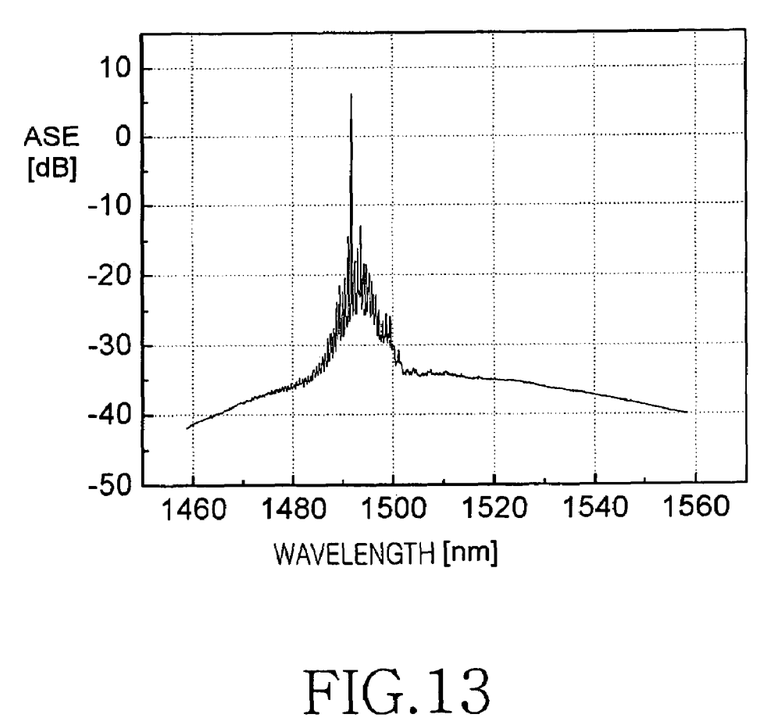
FIG. 13 is a graph showing a lasing mode of the semiconductor optical amplifier shown in FIG. 12.
Figure 14:
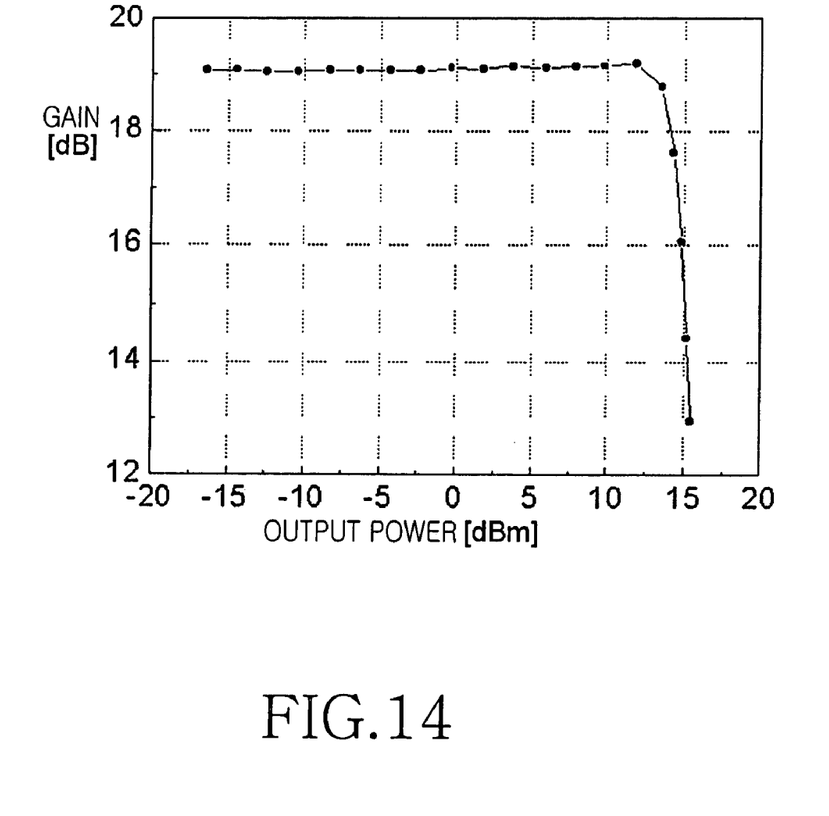
FIG. 14 is a graph showing a gain property of the semiconductor optical amplifier shown in FIG. 12.

FIG. 12 is a side cross-sectional view showing a construction of a gain-clamped semiconductor optical amplifier 1000 according to a fourth embodiment of the present invention. FIG. 13 is a graph showing the lasing mode of the semiconductor optical amplifier 1000 shown in FIG. 12. FIG. 14 is a graph showing the gain property of the semiconductor optical amplifier 1000 shown in FIG. 12.

The SOA 1000 includes a substrate 1010, a grating layer 1020, a gain waveguide 1030, a clad 1040, and first and second anti-reflection layers 1050 and 1055.

The grating layer 1020 is laminated on the substrate 1010 and includes a grating 1025 formed at one end portion of the grating layer 1020. The gain waveguide 1030 is laminated on the grating layer 1020 to be in contact with the grating 1025, and amplifies an optical signal input to the gain waveguide 1030. The clad 1040 is laminated on the gain waveguide 1030 and has a refractive index smaller than that of the gain waveguide 1030. The first anti-reflection layer 1050 is coated on a first end surface of the SOA 1000, and the second anti-reflection layer 1050 is coated on a second end surface of the SOA 1000.

FIG. 13 is a graph showing the lasing mode when current of 200 mA is applied to the SOA 1000. FIG. 14 shows a graph showing a gain property of the SOA 1000 when current of 200 mA is applied to the SOA 1000 and an optical signal having a wavelength of 1550 nm is input the SOA 1000.

The SOA 1000 can maximize the distribution of electric charge density in an input side by maximizing the difference of reflection factors between the input side and an output side. This improves a noise property of the SOA 1000. Further, the SOA 1000 can include mode conversion regions formed at the input side and the output side, similarly to the above-mentioned embodiments.

Figure 15:
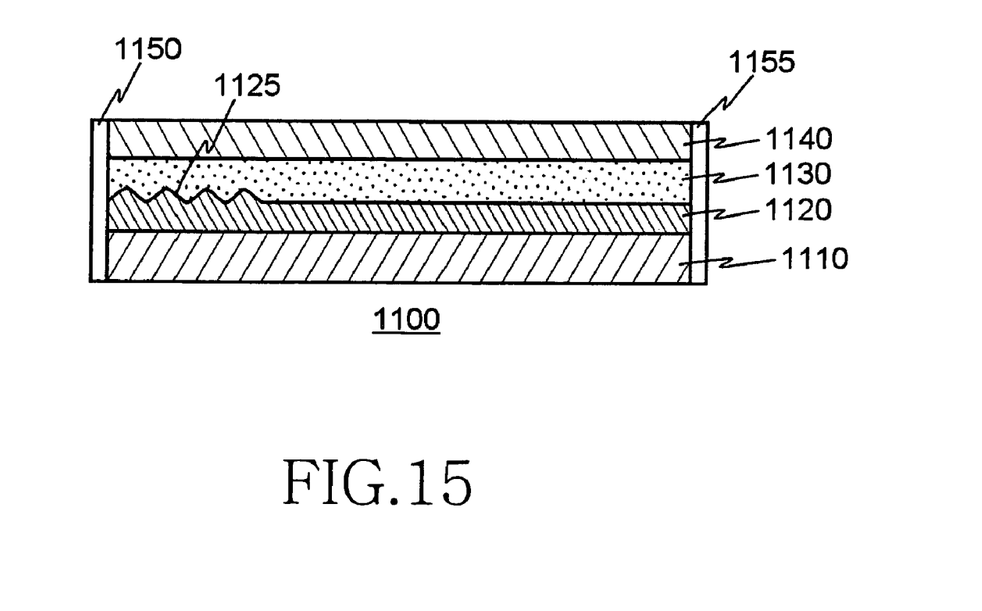
FIG. 15 is a side cross-sectional view showing the construction of a gain-clamped semiconductor optical amplifier according to a fifth embodiment of the present invention.

FIG. 15 is a side cross-sectional view showing the construction of a gain-clamped semiconductor optical amplifier 1100 according to a fifth embodiment of the present invention. The SOA 1100 includes a substrate 1110, a grating layer 1120, a gain waveguide 1130, a clad 1140, a anti-reflection layers 1150, and a high reflection layer 1155.

The grating layer 1120 is laminated on the substrate 1110 and includes a grating 1125 formed at one end portion in contact with a first end surface of the SOA 1100. The gain waveguide 1130 is laminated on the grating layer 1120 to be in contact with the grating 1125, and amplifies an optical signal input to the gain waveguide 1130. The clad 1140 is laminated on the gain waveguide 1130 and has a refractive index smaller than that of the gain waveguide 1130. The anti-reflection layer 1150 is coated on the first end surface of the SOA 1100, and the high reflection layer 1155 is coated on a second end surface of the SOA 1100. The first end surface of the SOA 1100 becomes an input/output side with respect to an optical signal. The optical signal input to the first end surface of the SOA 1100 is output through the first end surface of the SOA 1100 again.

A device having the same structure as that of the SOA 1100 is called a reflective gain-clamped SOA. The reflective gain-clamped SOA receives an optical signal from one optical fiber, amplifies the received optical signal, and then outputs the amplified optical signal through the same optical fiber. The optical signal is input to and output through the first end surface of the SOA 1100. In this way, transmission of the input optical signal and the output optical signal is performed through one optical fiber, so that usage of the optical fiber can be reduced by ½. In addition, since arrangement of the optical fiber and the SOA 1100 is performed only one time, time and cost for manufacturing the device is reduced. The anti-reflection layer 1150 reduces reflection of the input optical signal and the output optical signal.

According to an additional method for reducing the reflection, the gain waveguide 1130 can be inclined with a predetermined angle with respect to a normal line of the first end surface.

According to another method for reducing the reflection, the gain waveguide 1130 can start at a position spaced a predetermined distance from the first end surface.

Further, since the second end surface of the SOA 1100 must have high reflection factor, the high reflection layer 1155 may be coated on the second end surface of the SOA 1100. Accordingly, it is preferred that an end portion of the gain waveguide 1130, which is in contact with the high reflection layer 1155, is formed to be perpendicular to the second end surface of the SOA 1100. Further, since coupling efficiency with the optical fiber is considered only at the input/output side, it is preferred that a mode conversion region for improving the coupling efficiency is formed only at an end of the gain waveguide 1130 in contact with the first end surface of the SOA 1100. In this case, it is unnecessary to form the mode conversion region at an end of the gain waveguide 1130 in contact with the second end surface of the SOA 1100 not coupled to the optical fiber.

As described above, according to various gain-clamped semiconductor optical amplifier embodiments o f the present invention, a lasing, which is necessary for a gain-clamp of the semiconductor optical amplifier, can be stably achieved by forming a grating at both sides or only one end of a gain waveguide.

In addition, since the gain-clamped semiconductor optical amplifier embodiments of the present invention do not require a passive waveguide, an additional process for separately manufacturing the passive waveguide is unnecessary. Furthermore, this gain-clamped semiconductor optical amplifier embodiment does not suffer from problems caused by deterioration of optical coupling efficiency between a gain waveguide and a passive waveguide.

While the invention has been shown and described with reference to certain embodiments thereof, it will be understood by those skilled in the art that various changes in form and details may be made therein without departing from the spirit and scope of the invention as defined by the appended claims.

What is claimed is:

1. A gain-clamped semiconductor optical amplifier comprising:
   a gain waveguide for amplifying an optical signal input to the gain waveguide; and
   a grating layer having first and second gratings, the first grating disposed at a first end portion of the grating layer, and the second grating disposed at a second end portion of the grating layer,
   wherein the gain waveguide is disposed on the grating layer in a direct contact with the first grating and the first and second gratings have reflection factors different from each other, and the gain waveguide includes mode conversion regions formed at both sides of the gain waveguide, the mode conversion regions having a width which becomes narrower as it goes to a corresponding end of the semiconductor optical amplifier.

2. The gain-clamped semiconductor optical amplifier as claimed in claim 1, further comprising a clad laminated on the gain waveguide.

3. The gain-clamped semiconductor optical amplifier as claimed in claim 1, wherein the mode conversion regions are not in contact with the first and the second gratings.

4. The gain-clamped semiconductor optical amplifier as claimed in claim 1, wherein each of the mode conversion regions are in contact with a portion of a grating adjacent to the mode conversion region.

5. A gain-clamped semiconductor optical amplifier comprising:
- a gain waveguide for amplifying an optical signal input to the gain waveguide; and
- a grating layer having a first grating disposed at first end portion of the grating layer,
- wherein the gain waveguide is disposed on the grating layer in a direct contact with the first grating and the gain waveguide includes a mode conversion region formed at one end portion of the gain waveguide, the mode conversion region having a width which becomes narrower as it goes to an end adjacent to the semiconductor optical amplifier.

6. The gain-clamped semiconductor optical amplifier as claimed in claim 5, wherein the mode conversion region is not in contact with the first grating.

7. The gain-clamped semiconductor optical amplifier as claimed in claim 5, wherein the mode conversion region is in contact with a portion of the first grating.

8. A gain-clamped semiconductor optical amplifier comprising:
- a gain waveguide for amplifying an optical signal input to the gain waveguide;
- a grating layer having a first grating disposed at a first end portion of the grating layer; and
- non-reflection layers disposed on two portions of the semiconductor optical amplifier,
- wherein the gain waveguide is disposed on the grating layer in a direct contact with the first grating, and the gain waveguide includes mode conversion regions formed at both sides of the gain waveguide, the mode conversion regions having a width which becomes narrower as it goes to a corresponding end of the semiconductor optical amplifier.

9. A gain-clamped semiconductor optical amplifier comprising:
- a gain waveguide for amplifying an optical signal input to the gain waveguide;
- a grating layer having a first grating disposed at a first end portion of the grating layer;
- a non-reflection layer disposed on a first end surface of the semiconductor optical amplifier, the first end surface serving as an input/output side of the semiconductor optical amplifier; and
- a high reflection layer disposed on a second end surface of the semiconductor optical amplifier,
- wherein the gain waveguide is disposed on the grating layer in a direct contact with the first grating.

* * * * *